US008330211B2

(12) United States Patent
Sung et al.

(10) Patent No.: US 8,330,211 B2
(45) Date of Patent: Dec. 11, 2012

(54) SEMICONDUCTOR DEVICE WITH VERTICAL CHANNEL TRANSISTOR AND LOW SHEET RESISTANCE AND METHOD FOR FABRICATING THE SAME

(75) Inventors: Min-Gyu Sung, Ichon (KR); Kwan-Yong Lim, Ichon (KR)

(73) Assignee: Hynix Semiconductor Inc., Icheon-si (KR)

(*) Notice: Subject to any disclaimer, the term of this patent is extended or adjusted under 35 U.S.C. 154(b) by 277 days.

(21) Appl. No.: 12/165,382

(22) Filed: Jun. 30, 2008

(65) Prior Publication Data

US 2009/0166723 A1 Jul. 2, 2009

(30) Foreign Application Priority Data

Dec. 26, 2007 (KR) ........................ 10-2007-0137494

(51) Int. Cl.
*H01L 29/66* (2006.01)

(52) U.S. Cl. ................ 257/328; 257/E21.616; 438/268; 438/587

(58) Field of Classification Search .................. 257/328; 438/268, 270, 283, 587, 589, 595
See application file for complete search history.

(56) References Cited

U.S. PATENT DOCUMENTS

| | | | | |
|---|---|---|---|---|
| 4,156,247 | A * | 5/1979 | Hartman et al. | 257/245 |
| 6,855,983 | B1 | 2/2005 | Kushida | |
| 7,354,839 | B2 * | 4/2008 | Wei et al. | 438/305 |
| 2006/0097304 | A1 * | 5/2006 | Yoon et al. | 257/307 |

FOREIGN PATENT DOCUMENTS

| | | | |
|---|---|---|---|
| KR | 1020060041415 | A | 2/2006 |
| KR | 100660881 | B1 | 12/2006 |

* cited by examiner

*Primary Examiner* — Lex Malsawma

(74) *Attorney, Agent, or Firm* — Kilpatrick Townsend & Stockton LLP

(57) ABSTRACT

A memory device includes a substrate, a plurality of wordlines arranged over the substrate, a plurality of pillars formed over the substrate between the wordlines, a gate electrode surrounding external walls of the pillars to be connected to the wordlines, and an insulation layer for insulating one sidewall of each wordline from the gate electrode.

17 Claims, 16 Drawing Sheets

SEMICONDUCTOR DEVICE WITH VERTICAL CHANNEL TRANSISTOR AND LOW SHEET RESISTANCE AND METHOD FOR FABRICATING THE SAME

CROSS-REFERENCE TO RELATED APPLICATIONS

The present invention claims priority of Korean patent application number 2007-0137494, filed on Dec. 26, 2007, which is incorporated by reference in its entirety.

BACKGROUND OF THE INVENTION

The present invention relates to a method for fabricating a semiconductor device, and more particularly, to a semiconductor device with a vertical channel transistor and a method for fabricating the same.

Recently, memory devices of 40 nm or less are required to embody highly integrated semiconductor devices. However, it is difficult to scale a planar or a recessed gate transistor used for 8 $F^2$ (F: minimum feature size) or 6 $F^2$ cell architecture under 40 nm. Thus, a dynamic random access memory (DRAM) device having 4 $F^2$ cell architecture is required to increase the integration degree approximately 1.5 to 2 times while keeping scaling degree at the same level. Accordingly, a vertical channel transistor is introduced.

In the vertical channel transistor, a surround-type gate electrode is formed surrounding active pillars which are vertically extended from a substrate. Source and drain regions are respectively formed in upper and lower portions of the pillars around the gate electrode. Thus, its performance is not restricted by a channel length even though dimensions of the transistor decrease.

FIG. 1A is a cross-sectional view illustrating a structure of a typical semiconductor device with a vertical channel transistor. FIG. 1B is a top view of the typical semiconductor device.

Referring to FIG. 1A, a plurality of pillar structures 100 including a body pillar 12, a head pillar 13, a buffer pattern 14, a hard mask pattern 15, and a capping layer 16 are formed over a substrate 11.

A gate insulation layer 17 and a gate electrode 18 are formed to surround an external wall of the body pillar 12. A buried bit line 19 is formed in the substrate 11. An inter-layer insulation layer 20 is buried in a trench 19A for dividing neighboring bit lines 19.

A wordline 21 is formed in a direction crossing the bit line 19 while being connected to the gate electrode 18.

In the typical method described above, a polysilicon layer is used as the gate electrode 18 and a metal layer is used as the wordline 21.

However, since the wordline 21 is not a metal layer spread continuously in the typical method, but a discontinuous metal layer separated by the polysilicon layer (i.e., the gate electrode 18), the total sheet resistance $R_s$ of the wordline increases affecting driving current flowing through the wordline 21.

For instance, referring to FIG. 1B, since the wordline 21 also includes the polysilicon layer between segments of the metal layers, the driving current flowing through the wordline 21 decreases due to sheet resistance $R_p$ of the polysilicon layer, which is greater than the sheet resistance $R_m$ of the metal layer. Thus, it is difficult to embody high-speed operation.

SUMMARY OF THE INVENTION

Embodiments of the present invention relate to a semiconductor device with a vertical channel transistor and a method for fabricating the same. This invention overcomes limitations of the typical method by providing a semiconductor device with a vertical transistor that can decrease sheet resistance of a wordline to thereby embody high-speed operation and a method for fabricating the same.

In accordance with an aspect of the present invention, there is provided a memory device including a substrate, a plurality of wordlines arranged over the substrate, a plurality of pillars formed over the substrate between the wordlines, a gate electrode surrounding external walls of the pillars to be connected to the wordlines, and an insulation layer for insulating one sidewall of each wordline from the gate electrode.

In accordance with another aspect of the present invention, there is provided a method for fabricating a semiconductor device. The method includes providing a substrate, forming a plurality of pillar structures over the substrate, forming a gate electrode for surrounding lower external wall of the pillar structures, forming an insulation layer for covering one sidewall of each pillar structure including the gate electrode, and forming wordlines which are arranged between the pillar structures to be connected to the gate electrode on one side and to be insulated by the insulation layer from the gate electrode on the other side.

In accordance with another aspect of the present invention, there is provided a method for fabricating a semiconductor device. The method includes providing a substrate, forming a plurality of pillar structures over the substrate, forming a gate electrode to surround a lower external wall of the pillar structure, forming an inter-layer insulation layer to insulate the pillar structures including the gate electrode from each other, forming a line-type damascene pattern to expose neighboring gate electrodes by selectively etching the inter-layer insulation layer, forming an insulation layer to cover one sidewall of the damascene pattern, and forming wordlines to be connected to the gate electrode buried in the damascene pattern and exposed.

DESCRIPTION OF SPECIFIC EMBODIMENTS

Embodiments of the present invention relate to a semiconductor device with a vertical channel transistor and low sheet resistance and a method for fabricating the same.

Figure 2A:
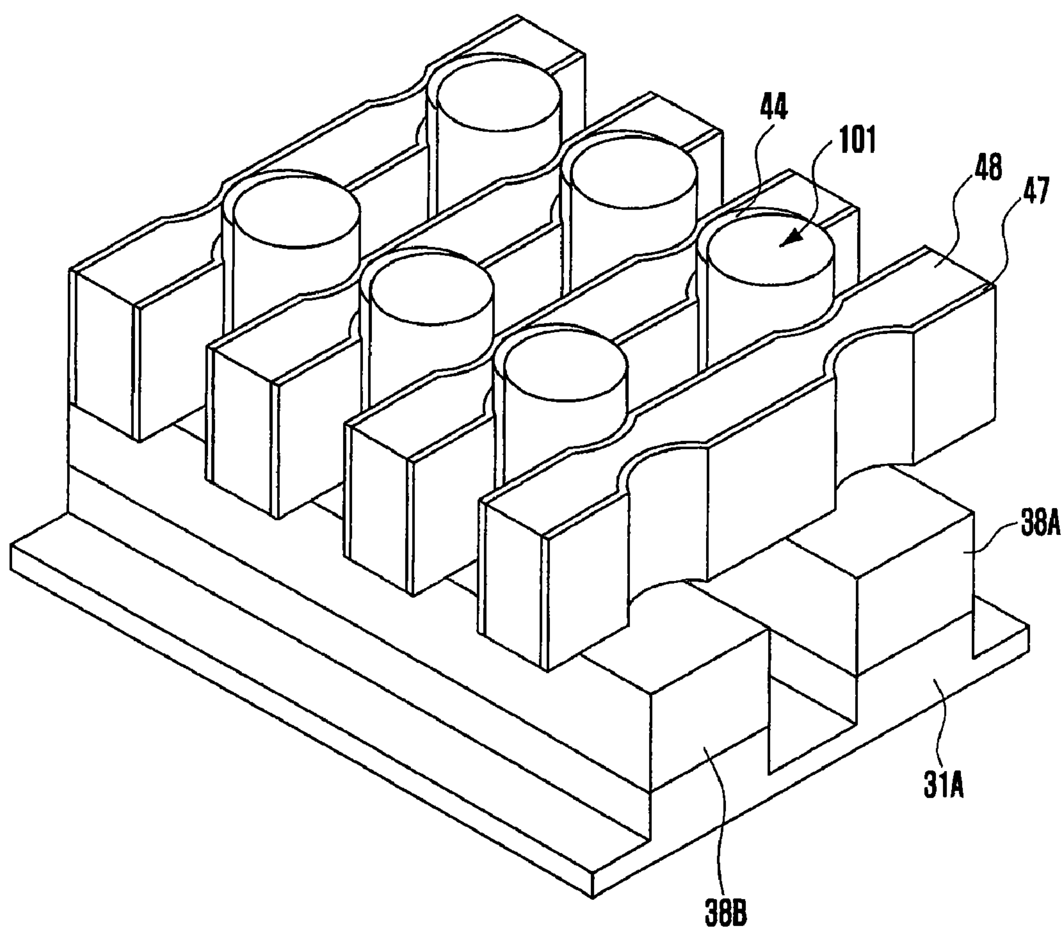
FIG. 2A is a perspective view showing a semiconductor device with a vertical channel transistor in accordance with an embodiment of the present invention.
Figure 2B:
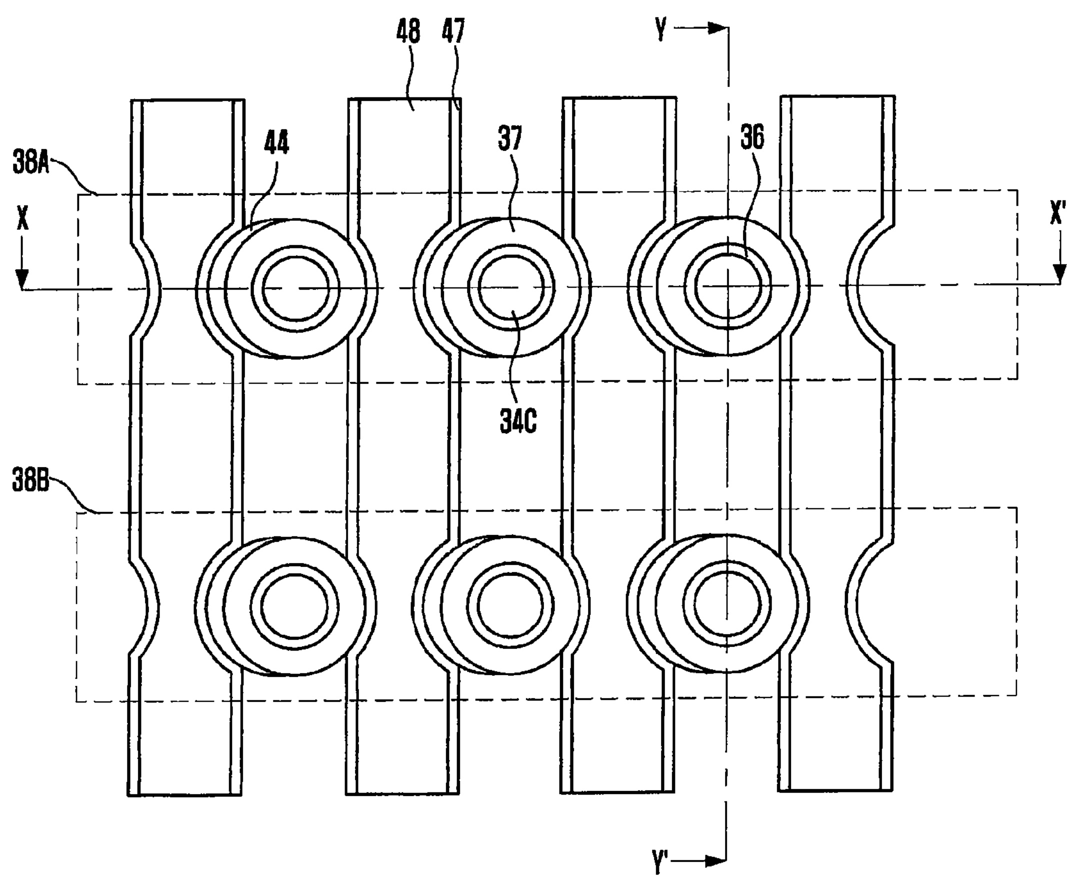
FIG. 2B is a top view showing a semiconductor device with a vertical channel transistor in accordance with an embodiment of the present invention.
Figure 2C:
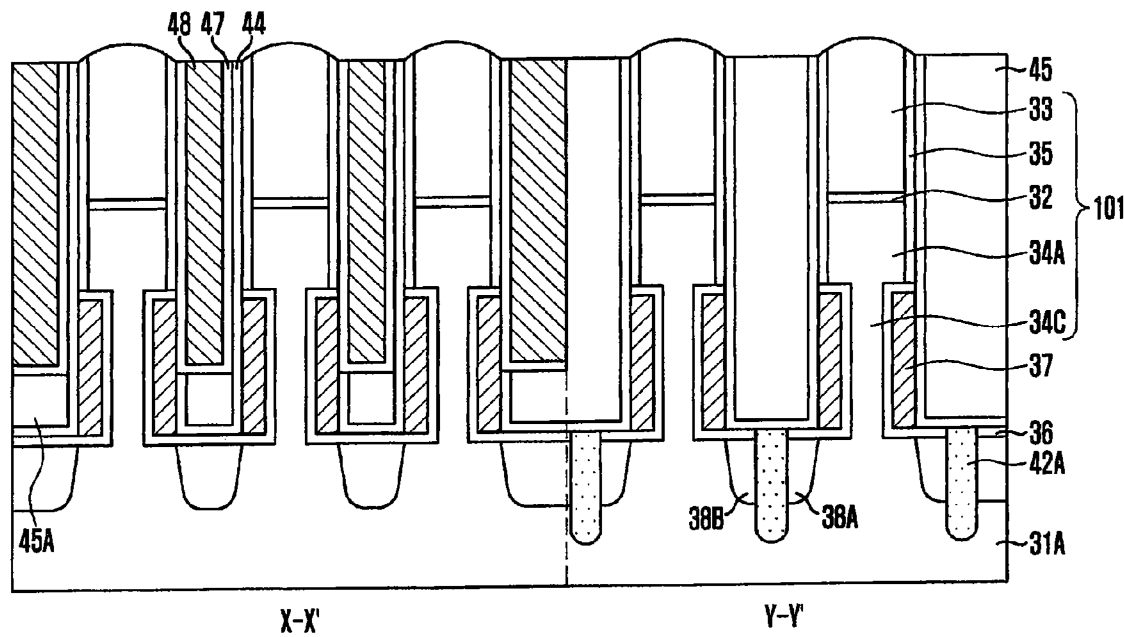
FIG. 2C is a cross-sectional view of the semiconductor device in accordance with an embodiment of the present invention.

FIG. 2A is a perspective view showing a semiconductor device with a vertical channel transistor in accordance with an embodiment of the present invention. FIG. 2B is a top view showing a semiconductor device with a vertical channel transistor in accordance with an embodiment of the present invention. FIG. 2C is a cross-sectional view of the semiconductor device in accordance with an embodiment of the present invention.

Referring to FIGS. 2A to 2C, a plurality of pillar structures 101 are formed in a matrix form over a substrate 31A with a certain gap therebetween. The pillar structure 101 may include a body pillar 34C, a head pillar 34A, a buffer pattern 32, a hard mask pattern 33, and a first capping layer 35.

A gate insulation layer 36 is formed over a surface of the body pillar 34C and the substrate 31A of the pillar structure 101. A gate electrode 37 can be formed to surround an external wall of the body pillar 34C.

A second capping layer 44 is formed to surround one sidewall of the pillar structure 101. The second capping layer 44 may include a nitride layer, e.g., a silicon nitride layer.

An impurity implantation process is performed to form buried first and second bit lines 38A and 38B in the substrate 31A.

A metal layer 48 is formed between the pillar structures 101 in a direction crossing the first and second bit lines 38A and 38B formed in the substrate 31A. Particularly, the metal layer 48 is electrically connected to neighboring gate electrodes on one side and is insulated by the second capping layer 44 from the gate electrodes on the other side.

The gate electrode 37 includes a polysilicon layer and the metal layer 48 used as a wordline includes a metal silicide layer or a metal layer. The metal silicide layer may be a tungsten silicide layer and the metal layer may be one selected from the group consisting of titanium nitride (TiN), W, aluminum (Al), copper (Cu), gold (Au) and ruthenium (Ru) layers. A barrier layer 47 can be formed between the gate electrode 37 and the metal layer 48 for a wordline. The barrier layer 47 may include one selected from the group consisting of TiN, TaCN, TaC, WN, WSiN, TaN, Ti, and $WSi_x$.

Figure 1A:
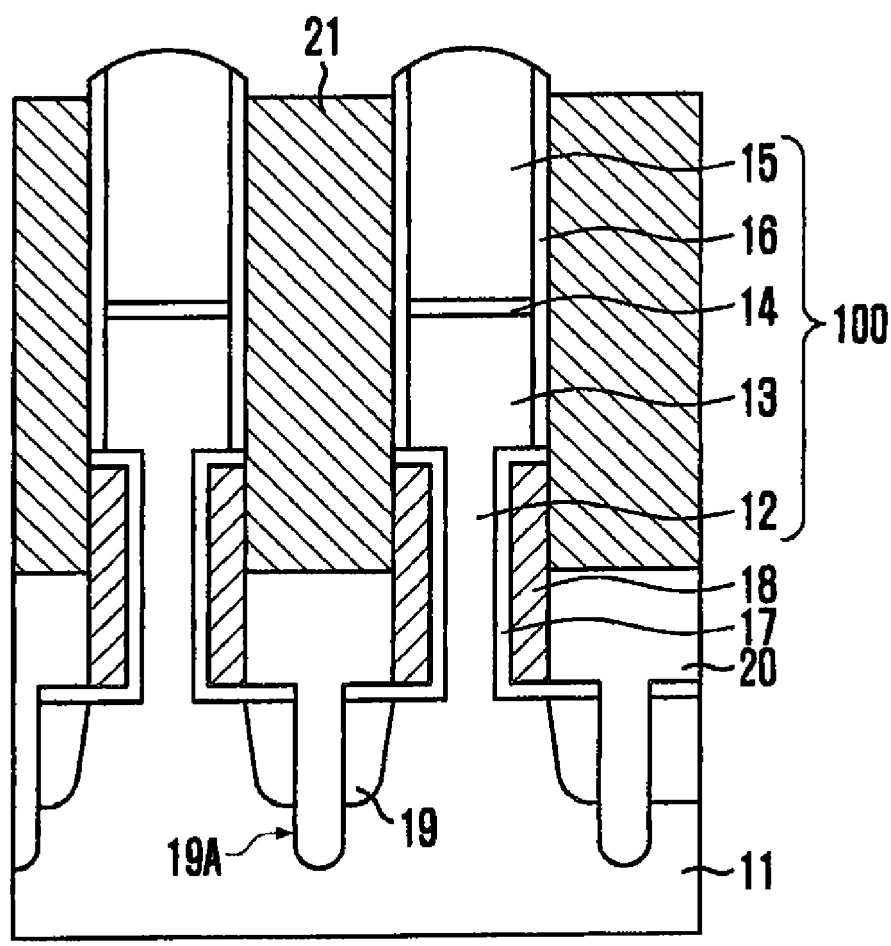
FIG. 1A is a cross-sectional view illustrating a structure of a typical semiconductor device with a vertical channel transistor.
Figure 1B:
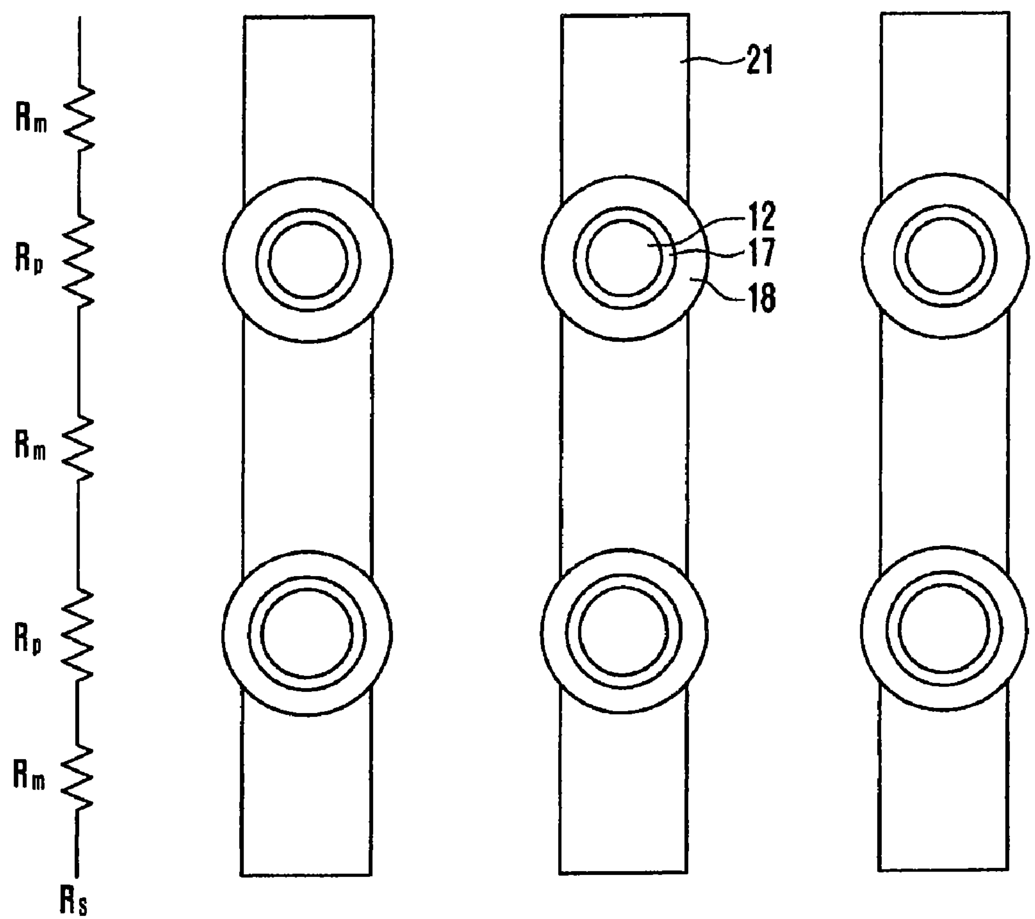
FIG. 1B is a top view of the typical semiconductor device.

Referring to FIGS. 2A to 2C, since the metal layer 48 used as a wordline is formed as a uniform layer, sheet resistance of the wordline decreases. That is, the wordline having a stack structure of metal layers has a lower sheet resistance than a wordline having a stack structure of a metal layer and a polysilicon layer (refer to FIG. 1B). Accordingly, it is easy to embody a high-speed device.

FIGS. 3A to 3M are cross-sectional views describing a method for fabricating a semiconductor device with a vertical channel device in accordance with a first embodiment of the present invention.

Figure 3A:
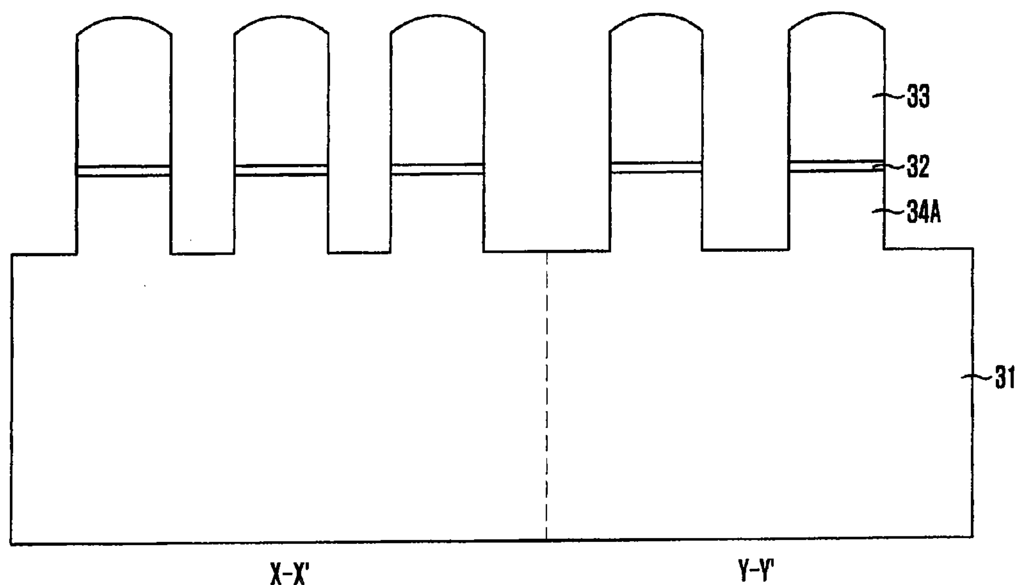
FIGS. 3A to 3M are cross-sectional views describing a method for fabricating a semiconductor device with a vertical channel device in accordance with a first embodiment of the present invention.

Referring to FIG. 3A, a buffer pattern 32 and a hard mask pattern 33 are formed over the substrate 31. The buffer pattern 32 may be a silicon oxide ($SiO_2$) layer formed through thermal oxidation and can be formed to have a thickness of approximately 50 Å to approximately 150 Å. The hard mask pattern 33 may be formed of a material having an etch selectivity ratio to the buffer pattern 32 and the substrate 31 [e.g., a silicon nitride ($Si_3N_4$) layer or a silicon carbide (SiC) layer] and have a thickness of approximately 2,000 Å.

A first pillar etch process is performed to etch the substrate 31 to a certain depth, e.g., a depth of approximately 1,100 Å, using the hard mask pattern 33 as an etch barrier. Thus, a head pillar 34A functioning as an active region is formed. An anisotropic dry etch process may be performed to etch the substrate 31, thereby forming the head pillar 34A. During the first pillar etch process, chlorine ($Cl_2$) gas or hydrogen bromide (HBr) gas may be used alone or a gas mixture of $Cl_2$ and HBr may be used.

Figure 3B:
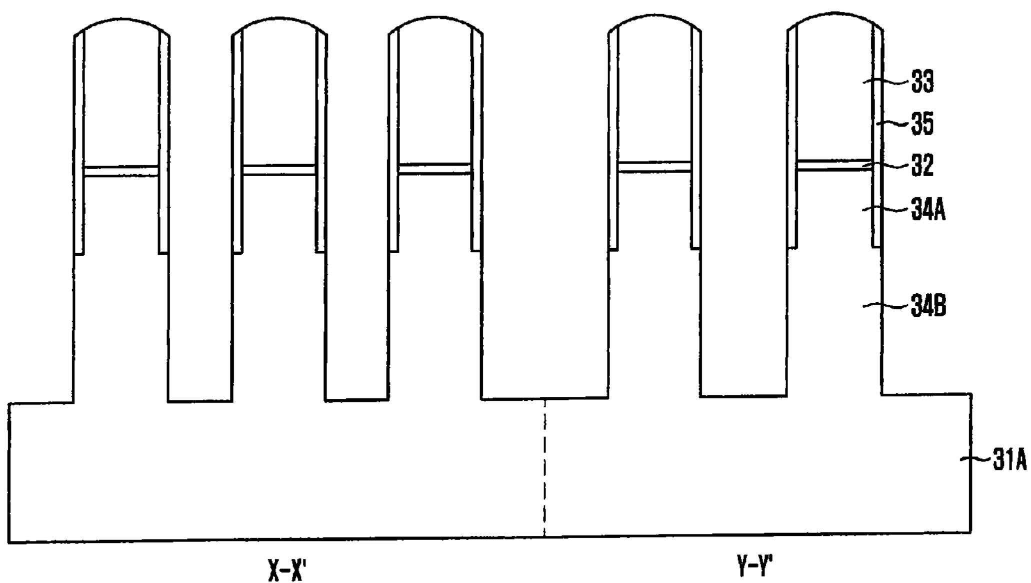

Referring to FIG. 3B, a first capping layer 35 is formed over a resultant structure. The first capping layer 35 may be a nitride layer or a stack of an oxide layer and a nitride layer. The oxide layer may be the $SiO_2$ layer and the nitride layer may be the $Si_3N_4$ layer. An etch process, e.g., an etch-back process, is performed to expose the substrate 31 between the head pillars 34A, but allow the first capping layer 35 to remain on the sidewalls of the head pillar 34A. After the etch process, the first capping layer 35 also remains on the sidewalls of the hard mask pattern 33 and the buffer pattern 32. The first capping layer 35 having a thickness of approximately 50 Å to approximately 100 Å functions as a capping layer for protecting sidewalls of the head pillar 34A from being damaged in a subsequent process.

A second pillar etch process is performed to etch the substrate 31 (exposed after formation of the first capping layer 35) to a certain depth, e.g., approximately 2,000 Å. Thus, a body pillar 34B is formed below the head pillar 34A. The body pillar 34B may be higher than the head pillar 34A formed in the first pillar etch process. An anisotropic dry etch process may be performed to etch the substrate 31 and form the body pillar 34B. During the second pillar etch process, $Cl_2$ gas or HBr gas may be used alone or a gas mixture of $Cl_2$ and HBr may be used. Thus, the etched substrate 31 with the body pillar 34B formed therein is called a substrate pattern 31A.

As described above, the body pillar 34B of a certain height is formed on the substrate pattern 31A after the second pillar etch process.

Figure 3C:
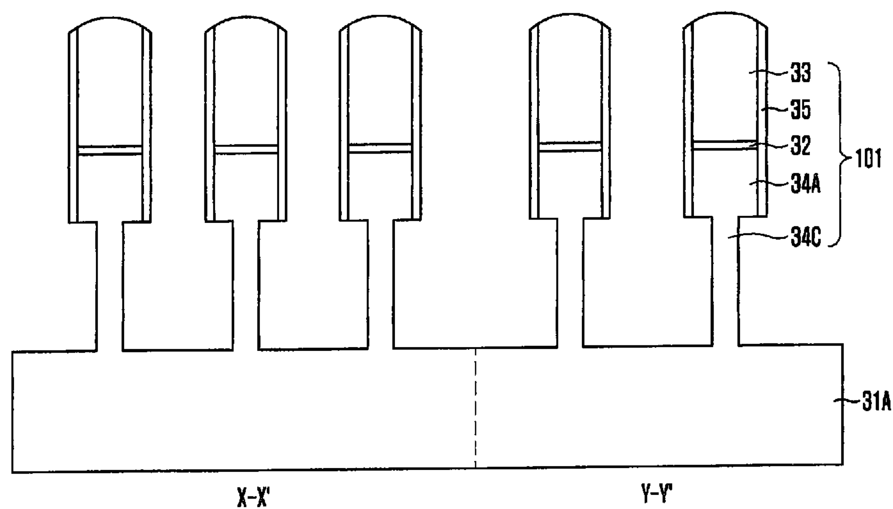

Referring to FIG. 3C, a third pillar etch process is performed to isotropically etch sidewalls of the body pillar 34B. The isotropic third pillar etch process may be a wet etch process or a chemical dry etch (CDE) process.

The isotropic etch process described above is called a pillar trimming process. The isotropic etch process is performed on the exposed sidewall of the body pillar 34B to a depth of approximately 150 Å. The head pillar 34A covered with the first capping layer 35 is not etched.

Thus, the body pillar 34C and the head pillar 34A form a T-shaped pillar structure. The body pillar 34C is a channel region to be surrounded by a gate electrode. The head pillar 34A covered with the first capping layer 35 is perpendicularly connected to a storage node.

Through the above pillar etch processes, the pillar structure 101 including the head pillar 34A and the body pillar 34B is formed.

Figure 3D:
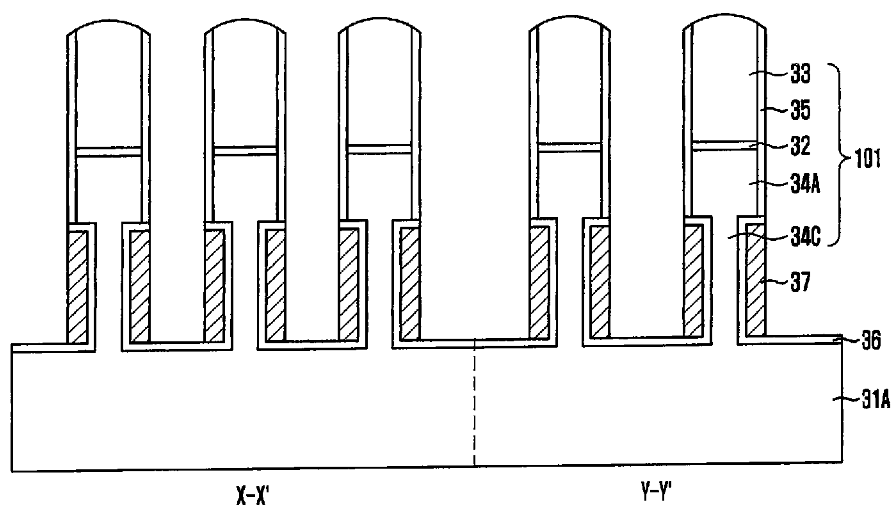

Referring to FIG. 3D, a gate insulation layer 36 is formed on a surface of the exposed substrate pattern 31A and the body pillar 34C. The gate insulation layer 36 may include a silicon oxide layer and be formed by a deposition process or an oxidation process.

A gate electrode 37 is formed to surround sidewalls of the body pillar 34C. A conductive layer is deposited over a resultant structure of the substrate pattern 31A, and an etch-back process is performed until the gate insulation layer 36, formed over the substrate pattern 31A between the pillar structures 101, is exposed. As a result, the gate electrode is formed. The gate electrode 37 may be a polysilicon layer doped with N-type impurities or P-type impurities. The gate electrode 37 may include any one selected from the group consisting of Ta, W, and Ti or any one selected from the group consisting of TaN, WN, and TiN. Since polysilicon layers have good step coverage, a polysilicon layer may be used as the gate electrode 37 to surround sidewalls of the body pillar 34C.

The gate electrode 37 functions as a gate electrode of a vertical channel transistor while simultaneously functioning as a wordline together with a subsequent metal layer.

Figure 3E:
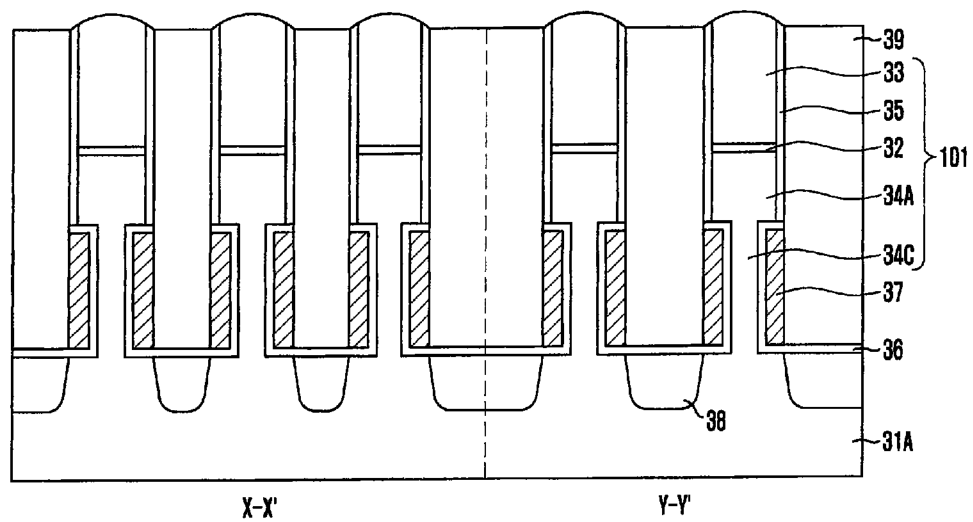

Referring to FIG. 3E, impurities, e.g., phosphorus (P) or arsenic (As), are doped into the substrate pattern 31A between the pillar structures 101 to form an impurity region 38. A buried bit line is to be formed in the impurity region 38.

A first inter-layer insulation layer 39 is formed over a resultant structure to fill the gap between the pillar structures 101. The first inter-layer insulation layer 39 may be a phosphosilicate glass (BPSG) layer having good gapfill characteristics. After the first inter-layer insulation layer 39 is formed, a planarization process such as chemical mechanical polishing (CMP) can be performed until the hard mask pattern 33 exposes its surface to remove a height difference.

Figure 3F:
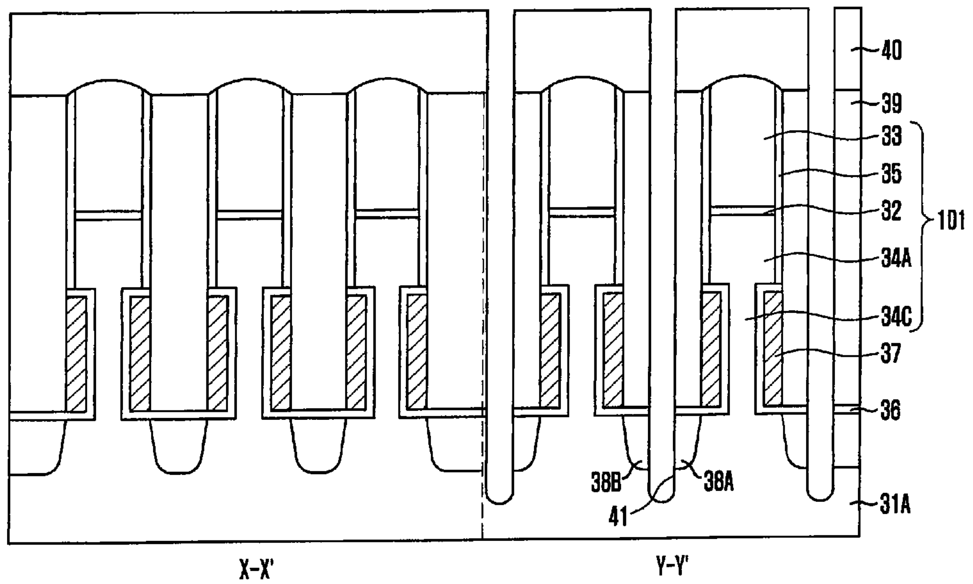

Referring to FIG. 3F, a first photoresist pattern 40 is formed in the form of line-spaces to expose the gap between the pillar structures 101 arranged in a Y-Y' direction. The first photoresist pattern 40 covers an upper portion of the pillar structure 101 arranged in an X-X' direction.

The first inter-layer insulation layer 39 and the gate insulation layer 36 are etched using the first photoresist pattern 40. The substrate pattern 31A is etched to a certain depth to form a first trench 41 for dividing the impurity region 38.

The impurity region 38 is divided by the first trench 41 to form first and second bit lines 38 A and 38B. Since the first and the second bit lines 38A and 38B are formed in a buried shape, they are called buried bit lines. The gate insulation layer 36 functions as a gate insulation layer while simultaneously electrically insulating the first and the second bit lines 38A and 38B which are apart from the gate electrode 37. The divided first and second bit lines 38A and 38B are vertical to the gate electrode 37.

Figure 3G:
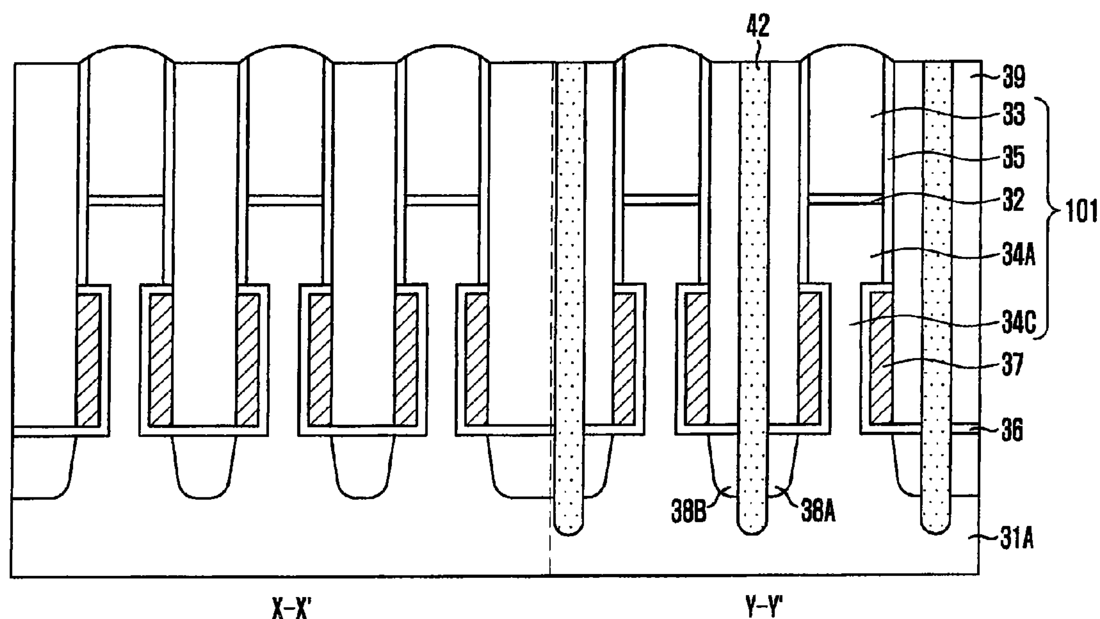

Referring to FIG. 3G, a second inter-layer insulation layer 42 is formed to fill the first trench 41 after the first photoresist pattern 40 is removed. The second inter-layer insulation layer 42 may be a BPSG layer having good gapfill characteristics. The second inter-layer insulation layer 42 functions as an insulation layer between neighboring pillars 34C and between the first and second bit lines 38A and 38B neighboring each other.

The second inter-layer insulation layer 42 is planarized to expose a surface of the pillar structure 101.

Figure 3H:
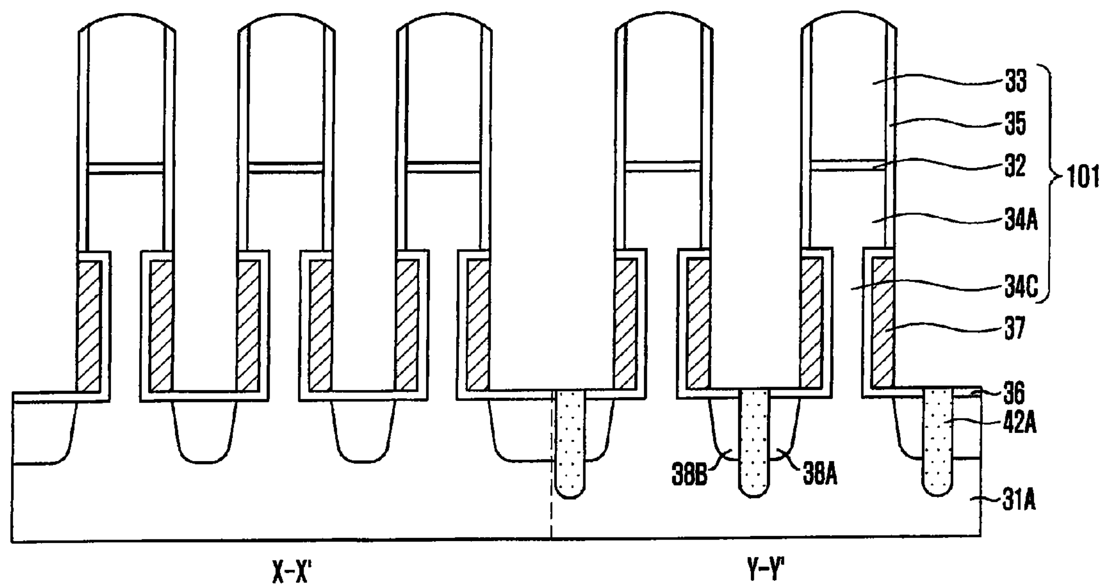

Referring to FIG. 3H, the second inter-layer insulation layer 42 and the first inter-layer insulation layer 39 are removed. The etch process for removing the first inter-layer insulation layer 42 is performed until a surface of the gate insulation layer arranged in the X-X' direction is exposed. Thus, the first inter-layer insulation layer 39 does not remain in the X-X' direction. A second inter-layer insulation pattern 42A remains to insulate the first and second bit lines 38A and 38B.

Figure 3I:
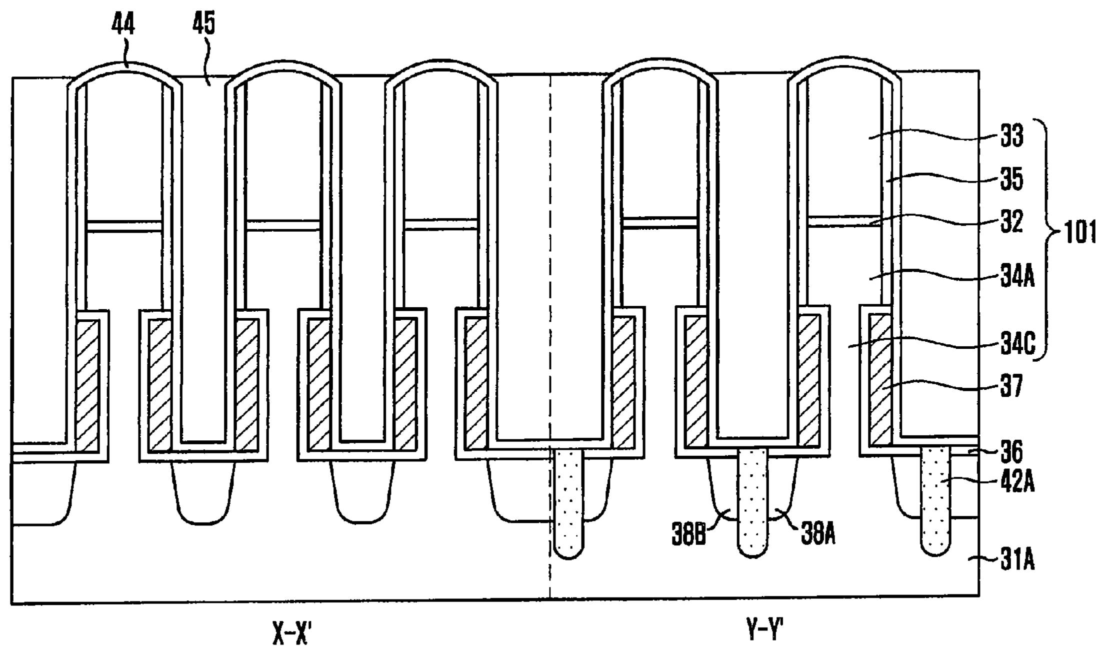

Referring to FIG. 3I, a second capping layer 44 and a third inter-layer insulation layer 45 are sequentially deposited over a resultant structure, thereby insulating the pillar structures 101 from each other. The second capping layer 44 may include a nitride layer, e.g., a silicon nitride layer.

The CMP or the etch-back process is performed to expose a surface of the pillar structures 101. Thus, the second capping layer 44 and the third inter-layer insulation layer 45 remain between the pillar structures 101.

Figure 3J:
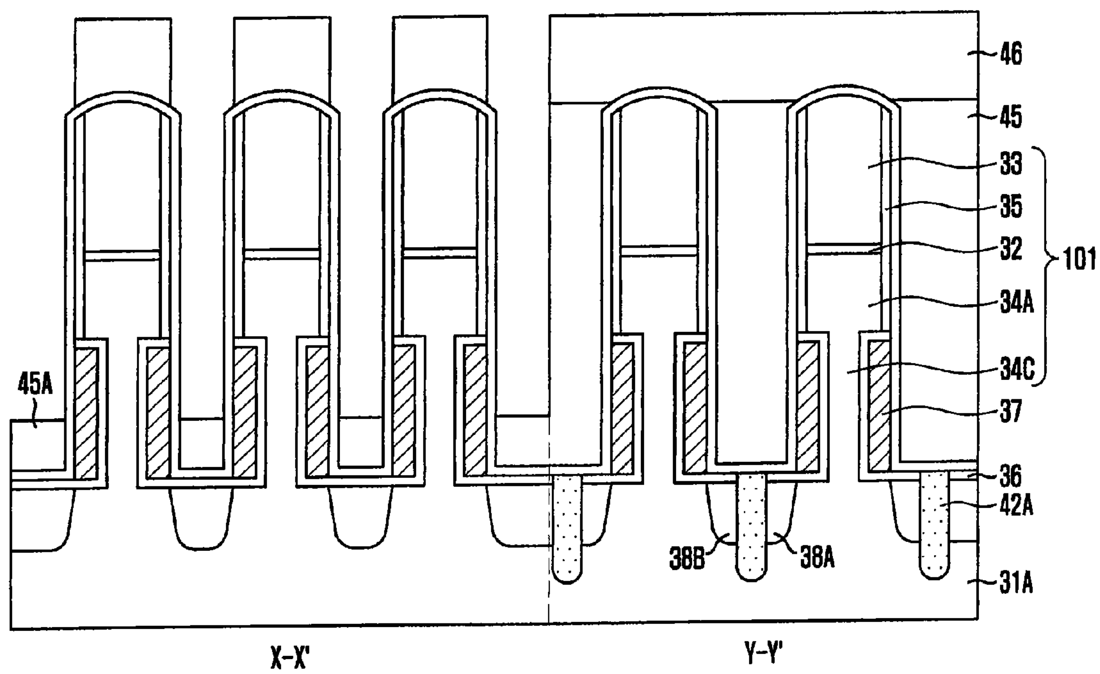

Referring to FIG. 3J, a second photoresist pattern 46 is formed to form a wordline. The second photoresist pattern 46 completely covers the pillar structures 101 arranged in the Y-Y' direction and covers only an upper portion of the pillar structures 101 arranged in the X-X' direction.

The third inter-layer insulation layer 45 is selectively etched using the second photoresist pattern 46 as an etch barrier. Thus, a third inter-layer insulation pattern 45A remains in the X-X' direction to selectively fill the gap between the pillar structures 101. In the Y-Y' direction, the third inter-layer insulation layer 45 remains between the pillar structures 101.

Figure 3K:
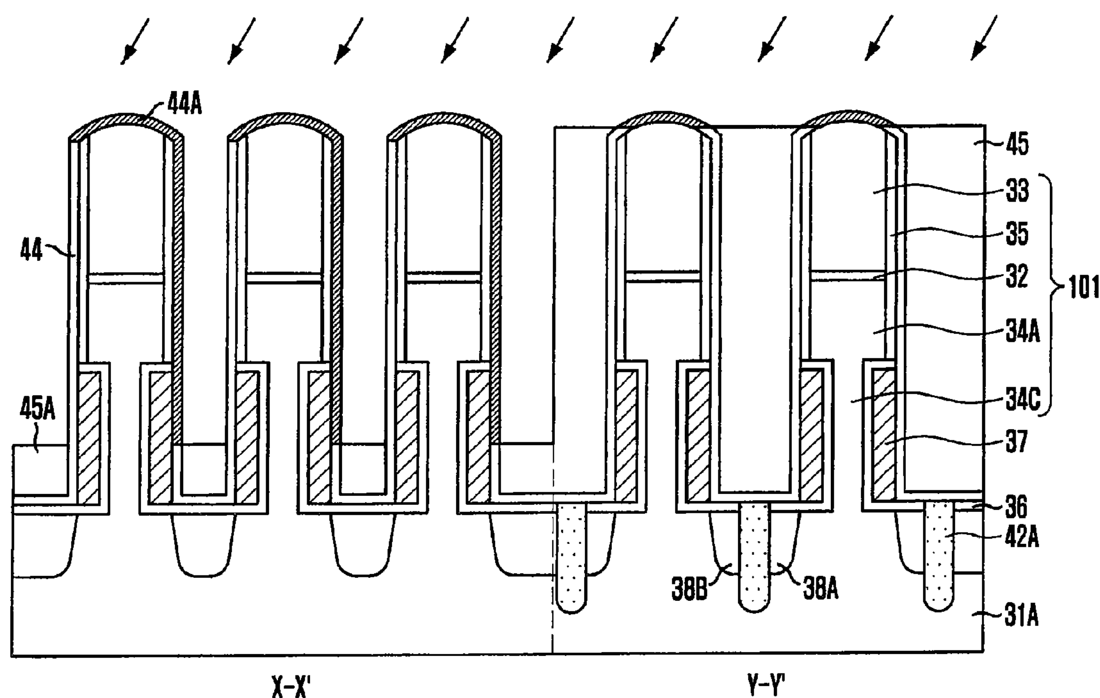

Referring to FIG. 3K, the second photoresist pattern 46 is removed and an oxygen ion implantation process is performed at a tilt. Thus, a portion of the second capping layer 44 is oxidized to form an oxidation deformation layer 44A. That is, when the second capping layer 44 is a silicon nitride layer, it is deformed into a silicon oxide nitride layer by the oxygen ion implantation process.

A portion of the second capping layer 44 covering the pillar structures 101 is deformed into the oxidation deformation layer 44A by the oxygen ion implantation process. Particularly, an upper portion and one sidewall of the pillar structures 101 are deformed by the oxygen implantation process performed at a tilt. Since ions are not implanted into the other sidewall, the other sidewall is not deformed and retains the characteristic of the silicon nitride layer.

A portion of the second capping layer 44 in the Y-Y' direction can be deformed by the oxygen ion implantation process.

Figure 3L:
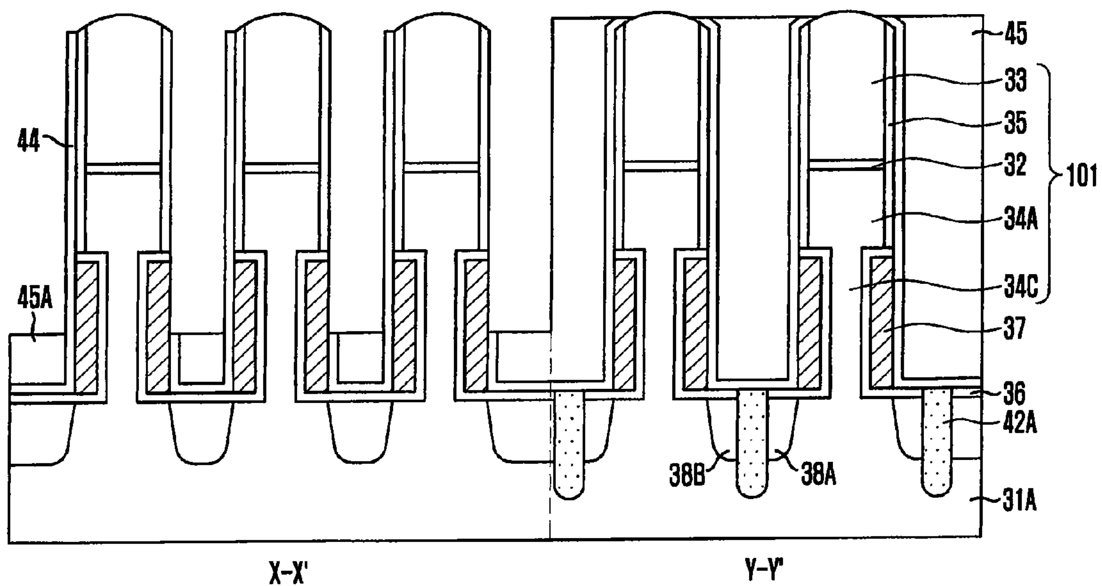

Referring to FIG. 3L, the oxide deforming layer 44A is selectively removed through wet rinsing process. Thus, the second capping layer 44 remains in the X-X' direction covering one sidewall of the pillar structures 101. When the oxide deforming layer 44A is a silicon oxynitride layer formed by the oxygen ion implantation process, a wet etch process using hydrogen fluoride (HF) solution is more effective than other ordinary etch processes using silicon dioxide ($SiO_2$). Thus, although some of the inter-layer insulation layers around the oxidation deformation layer 44A are etched, the loss is extremely small.

Figure 3M:
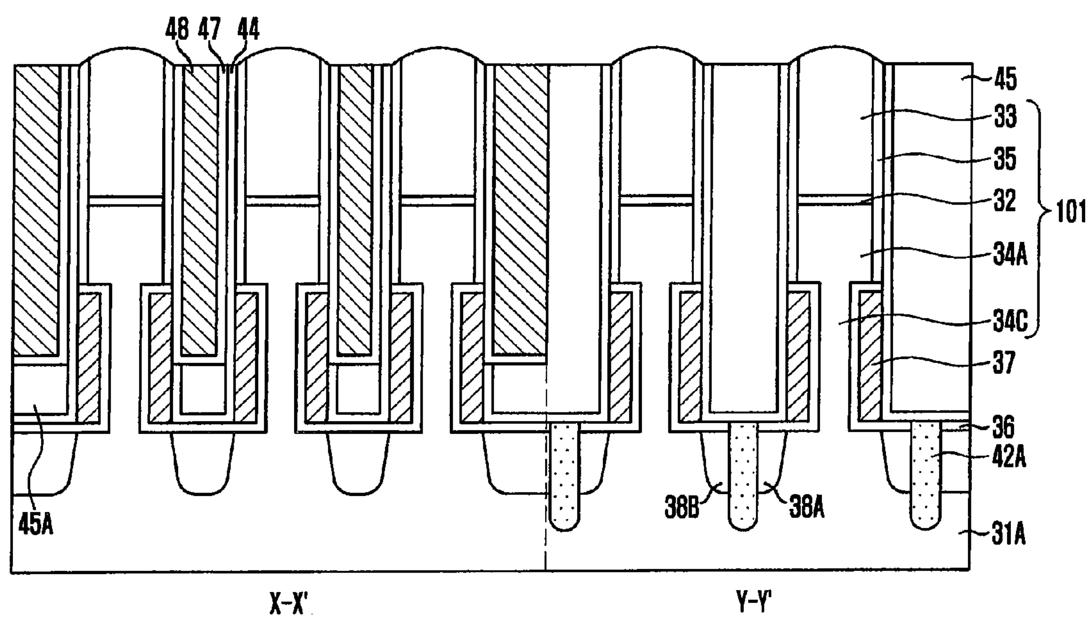

Referring to FIG. 3M, a barrier layer 47 and a metal layer 48 to be used as a wordline are deposited over a resultant structure. The metal layer 48 is formed until the gap between the pillar structures 101 is completely filled. The metal layer 48 may be a metal silicide layer or a metal layer including one selected from the group consisting of W, Al, Cu, Au, and Ru. The metal layer 48 is formed through one selected from the group consisting of atomic layer deposition (ALD), physical vapor deposition (PVD), and chemical vapor deposition (CVD) processes. The barrier layer 47 including one selected from the group consisting of WN, WSiN, TaN, Ti, and WSi layers functions as a diffusion barrier. The barrier layer 47 is formed by one of ALD, PVD, and CVD processes.

The barrier layer 47 and the metal layer 48 are planarized by a CMP process or an etch-back process.

The metal layer 48 is formed with a line pattern over the substrate between the pillar structures 101 and functions as a wordline.

The metal layer 48 is used as a wordline and is electrically connected to one side of neighboring gate electrodes and insulated from the other side of gate electrodes by the second capping layer 44.

In the first embodiment, since the metal layer 48 used as a wordline is a continuous layer including one material, it is possible to acquire a sheet resistance that is lower than a discontinuous wordline including the metal layer and the polysilicon layer which are connected to each other.

FIGS. 4A to 4E are cross-sectional views describing a method for fabricating a semiconductor device with a vertical channel transistor in accordance with a second embodiment of the present invention.

Figure 4A:
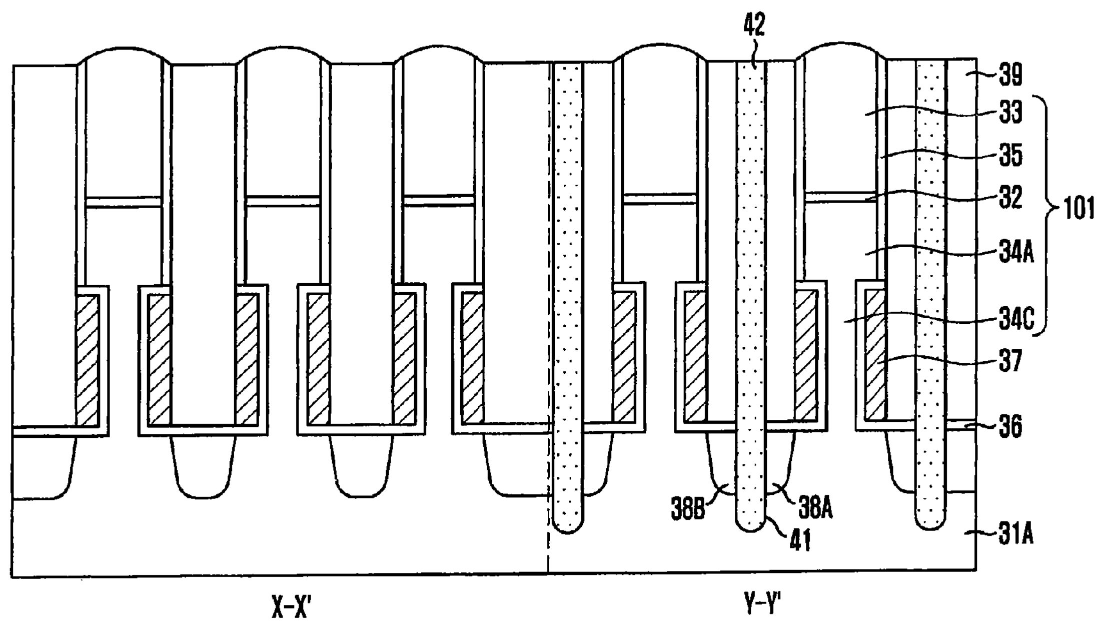
FIGS. 4A to 4E are cross-sectional views describing a method for fabricating a semiconductor device with a vertical channel transistor in accordance with a second embodiment of the present invention.

FIG. 4A shows a resultant structure acquired from the processes described in FIGS. 3A to 3G. FIGS. 4B to 4E are cross-sectional views illustrating a subsequent process.

FIG. 4A shows a resultant structure including a second inter-layer insulation layer 42 formed to fill the trench 41 for separating the bit lines in accordance with the first embodiment of the present invention. The second inter-layer insulation layer 42 is formed according to the method shown in FIGS. 3A to 3G. The same reference numerals are given to the same elements.

Figure 4B:
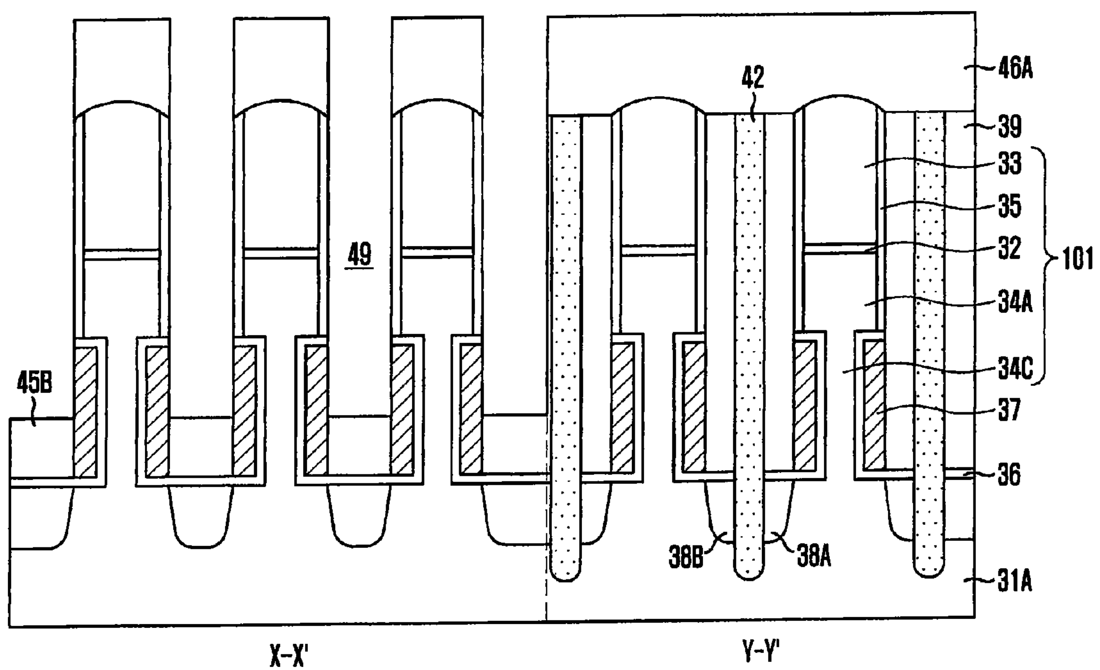

Referring to FIG. 4B, a second photoresist pattern 46A is formed to form a wordline. The second photoresist pattern 46A covers entire pillar structures in a Y-Y' direction and covers only an upper portion of the pillar structures in a X-X' direction.

A portion of the third inter-layer insulation layer 45 is etched using the second photoresist pattern 46A as an etch barrier. Thus, a third inter-layer insulation pattern 45B remains filling the gap between the pillar structures in the X-X' direction and a damascene pattern 49 is formed between the pillar structures to bury the wordline. The damascene pattern 49 exposes the entire sidewalls of neighboring pillar structures.

Figure 4C:
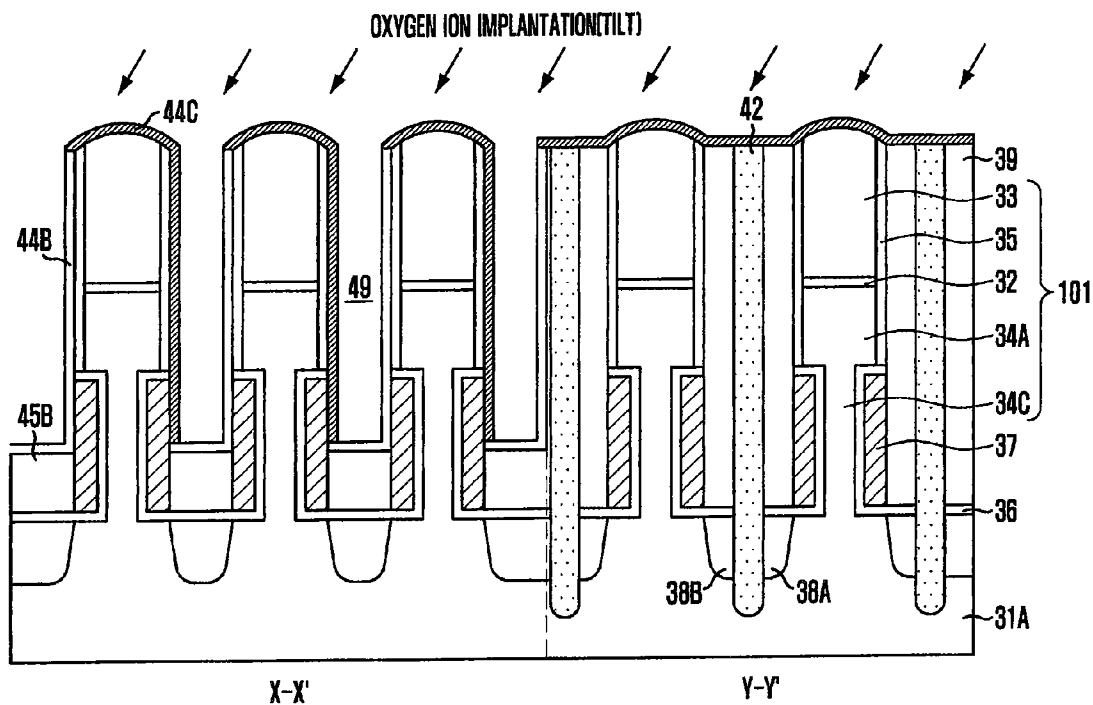

Referring to FIG. 4C, the second photoresist pattern 46A is removed and a second capping layer 44B is formed over a resultant structure.

An oxygen ion implantation process is performed. The oxygen ion implantation process is performed at a tilt. Thus, a portion of the second capping layer 44B is oxidized to form an oxidation deformation layer 44C. That is, when the second capping layer 44B is a silicon nitride layer, it is deformed into a silicon oxynitride layer by the oxygen ion implantation process.

A portion of the second capping layer 44B covering the pillar structure 101 is deformed into the oxidation deformation layer 44C by the oxygen ion implantation process. Particularly, an upper portion and one sidewall of the pillar structure 101 are mainly deformed by the oxygen ion implantation process performed at a tilt. Thus, the second capping layer 44B on the other sidewall is not ion-implanted and deformed, thus retaining characteristics of the silicon nitride layer.

A portion of the second capping layer can be deformed by the oxygen ion implantation process in the Y-Y' direction.

Figure 4D:
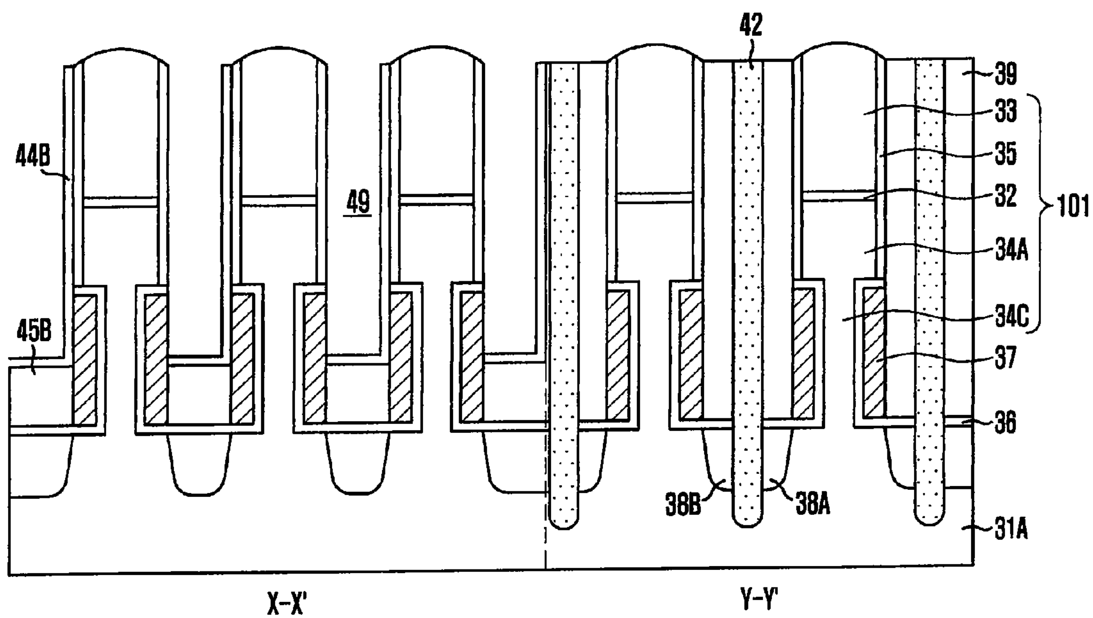

Referring to FIG. 4D, the oxidation deformation layer 44C is selectively removed by a wet rinsing process. Thus, the second capping layer 44B remains covering a sidewall of the pillar structure in the X-X' direction. The second capping layer 44B may entirely cover one sidewall and bottom of the damascene pattern.

Figure 4E:
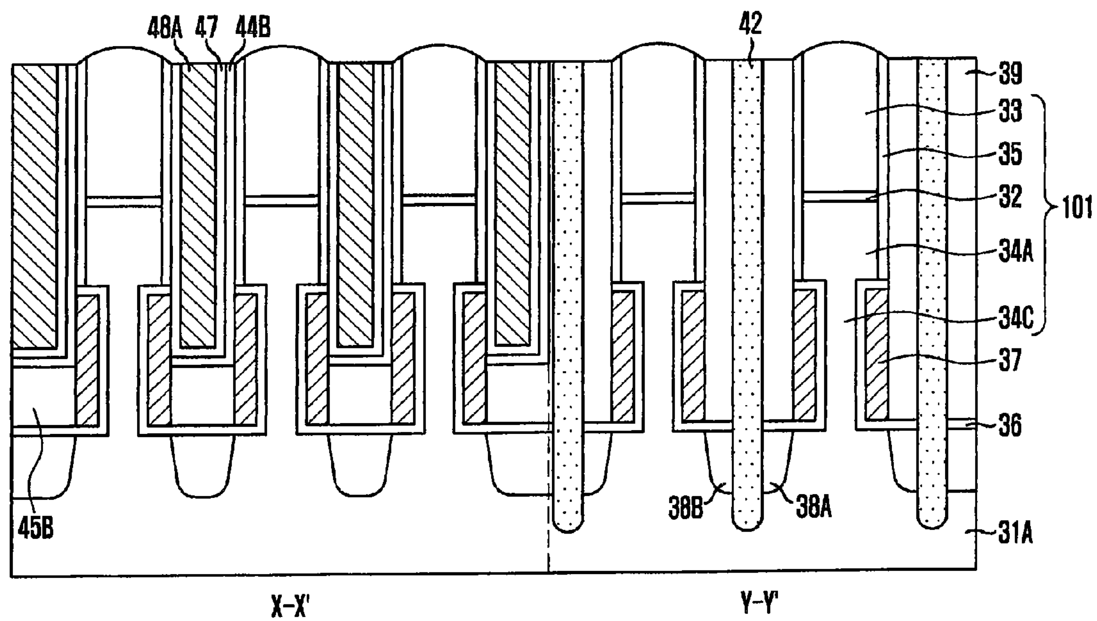

Referring to FIG. 4E, a barrier layer 47A and a metal pattern 48A to be used as a word line are sequentially formed over a resultant structure. The metal layer 48A is formed until the gap between the pillar structures 101 is sufficiently filled. The metal layer 48A may include one selected from the group consisting of W, Al, Cu, Au and Ru layers. The metal layer 48A is formed in an ALD, PVD, or CVD process. The barrier layer 47A including one of WN, WSiN, TaN, Ti, and WSi layers functions as a diffusion barrier. The barrier layer 47A is formed through an ALD, PVD, or CVD process.

The barrier layer 47A and the metal layer 48A are planarized by using a CMP process or an etch-back process.

Figure 5:
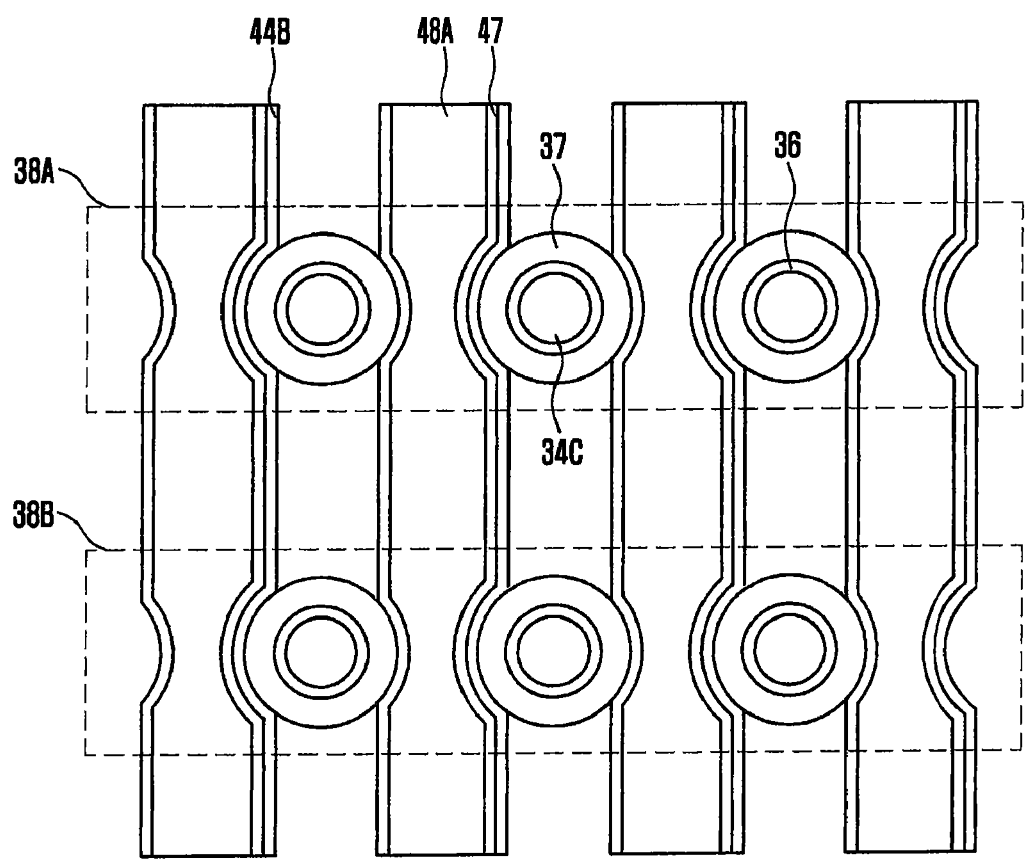
FIG. 5 is a top view of a semiconductor device fabricated in accordance with the second embodiment the present invention.

FIG. 5 is a top view of a semiconductor device fabricated in accordance with the second embodiment the present invention.

Referring to FIG. 5, the metal layer 48A is formed in a line pattern over a substrate between the body pillars 34C in the pillar structures 101 and functions as a wordline. Since the metal layer fills the damascene pattern, the second capping layer 44B remains on one sidewall and a bottom of the metal layer 48A. In detail, the second capping layer 44B completely covers one sidewall of the metal layer 48A used as a wordline. This is unlike the first embodiment where the second capping layer 44B surrounds one sidewall of the pillar structure including the gate electrode 37.

Thus, the metal layer 48A used as a wordline is electrically connected to one side of neighboring gate electrodes. The gate electrodes on the other side are insulated by the second capping layer 44B.

In the second embodiment, since the metal layer 48A used as a wordline is formed as a continuous single layer of a material, sheet resistance of the wordline decreases.

According to the above-described embodiments, since the metal layer 48 used as a wordline is formed as a continuous single layer, sheet resistance of the wordline decreases. That is, the wordline including a stack of metal layers has smaller sheet resistance than the wordline including a stack of a metal layer and a polysilicon layer.

Generally, impurities are implanted into the polysilicon layer to decrease the sheet resistance. However, the polysilicon layer doped with impurities has far higher sheet resistance than the metal layer.

The technology of this invention decreases the sheet resistance of the wordline, thereby increasing driving current. Also, when the sheet resistance of the wordline decreases, dimensions of memory array increase, thereby increasing cell efficiency.

This invention can be applied to any non-volatile memories, e.g., flash, SONOS, and TANOS, to form a vertical channel transistor.

This invention forms a wordline having a stack of metal layers, thereby decreasing sheet resistance of the wordline compared with a wordline having a stack of a polysilicon layer and a metal layer. Thus, it is easy to embody high-speed operation. Also, when the sheet resistance of the wordline decreases, dimensions of a memory array can decrease, thereby increasing cell efficiency.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A memory device, comprising:
- a substrate;
- a plurality of wordlines arranged over the substrate;
- a plurality of pillars formed over the substrate between the wordlines;
- a plurality of gate electrodes encircling a lower external wall of the pillars to be connected to the wordlines; and
- a plurality of insulation layers to insulate one sidewall of each wordline from one sidewall of each gate electrode so that the wordlines are connected to the gate electrodes on one side and insulated from the gate electrodes on the other side,
- wherein the wordlines are formed with a continuous metal layer filling the gap between the pillars in a first direction so that a single continuous metal layer is included in the first direction.

2. The device of claim 1, wherein each insulation layer partially covers the one sidewall of each gate electrode.

3. The device of claim 1, wherein each insulation layer covers the one sidewall of each wordline.

4. The device of claim 1, wherein the insulation layers include a nitride layer.

5. The device of claim 1, wherein the gate electrode includes a polysilicon layer or a metal layer, or both, and the wordlines include a metal silicide layer or a metal layer, or both.

6. The device of claim 1, wherein the plurality of pillars are distributed in a matrix arrangement.

7. The device of claim 1, wherein the single continuous metal layer of each wordline extends past at least two of the gate electrodes that are electrically connected to the single continuous metal layer.

8. A method for fabricating a semiconductor device, the method comprising:

providing a substrate;

forming a plurality of pillar structures over the substrate;

forming a plurality of gate electrodes encircling a lower external wall of the pillar structures;

forming a plurality of insulation layers to cover one sidewall of each pillar structure including each gate electrode; and forming a plurality of wordlines which are arranged between the pillar structures to be connected to the gate electrodes on one side and to be insulated by the insulation layer from the gate electrodes on the other side, wherein the wordlines are formed with a continuous metal layer filling the gap between the pillar structures in a first direction so that a single continuous metal layer is included in the first direction.

9. The method of claim 8, wherein forming the insulation layers comprise:

forming a nitride layer to cover the pillar structures including the gate electrodes;

oxidizing a portion of the nitride layer by implanting oxygen ions at a tilted angle; and selectively removing the oxidized portion in such a manner that the nitride layer remains on one sidewall of each pillar structure.

10. The method of claim 9, wherein the oxygen ion implantation process applies ion implantation energy ranging from approximately 0.5 keV to approximately 5 keV and implants ions in a dose ranging from approximately $1\times10^{15}$ atoms/cm$^2$ to approximately $1\times10^{17}$ atoms/cm$^2$.

11. The method of claim 8, wherein the gate electrodes include a polysilicon layer or a metal layer, or both, and the wordlines include a metal silicide layer or a metal layer, or both.

12. The method of claim 8, wherein the plurality of pillars are distributed in a matrix arrangement.

13. The method of claim 8, wherein the continuous metal layer of each wordline extends past at least two of the gate electrodes that are electrically connected to the continuous metal layer.

14. A method for fabricating a semiconductor device, the method comprising:

providing a substrate;

forming a plurality of pillar structures over the substrate;

forming a gate electrode to surround a lower external wall of the pillar structure;

forming an inter-layer insulation layer to insulate the pillar structures including the gate electrode from each other;

forming a line-type damascene pattern to expose neighboring gate electrodes by selectively etching the inter-layer insulation layer;

forming an insulation layer to cover one sidewall of the damascene pattern; and forming wordlines to be connected to the gate electrode buried in the damascene pattern.

15. The method of claim 14, wherein forming the insulation layer comprises:

forming a nitride layer over a resultant structure including the damascene pattern;

oxidizing a portion of the nitride layer by implanting ions at a tilted angle; and selectively removing the oxidized portion in such a manner that the nitride layer remains on one sidewall of the damascene pattern.

16. The method of claim 15, wherein the ion implantation process is performed by applying ion implantation energy ranging from approximately 0.5 keV to approximately 5 keV and implants ions in a dose ranging from approximately $1\times10^{15}$ atoms/cm$^2$ to approximately $1\times10^{17}$ atoms/cm$^2$.

17. The method of claim 14, wherein the gate electrode includes a polysilicon layer or a metal layer, or both, and the wordlines include a metal silicide layer or a metal layer, or both.

* * * * *